(12) United States Patent
Prejbeanu (10) Patent No.: US 8,064,245 B2
(45) Date of Patent: Nov. 22, 2011

(54) MAGNETIC RANDOM ACCESS MEMORY WITH AN ELLIPTICAL MAGNETIC TUNNEL JUNCTION

(75) Inventor: Ioan Lucian Prejbeanu, Sassenage (FR)

(73) Assignee: Crocus Technology S.A., Grenoble Cedex (FR)

( * ) Notice: Subject to any disclaimer, the term of this patent is extended or adjusted under 35 U.S.C. 154(b) by 115 days.

(21) Appl. No.: 12/467,171

(22) Filed: May 15, 2009

(65) Prior Publication Data
US 2009/0290413 A1   Nov. 26, 2009

(30) Foreign Application Priority Data
May 20, 2008 (EP) .................................. 08290468

(51) Int. Cl.
*G11C 11/00* (2006.01)
(52) U.S. Cl. ..... 365/158; 365/171; 365/173; 365/189.16
(58) Field of Classification Search .................. 365/158, 365/171, 189.16, 173
See application file for complete search history.

(56) References Cited

U.S. PATENT DOCUMENTS

| | | | |
|---|---|---|---|
| 4,949,039 A | 8/1990 | Grünberg |
| 5,159,513 A | 10/1992 | Dieny et al. |
| 5,343,422 A | 8/1994 | Kung et al. |
| 5,583,725 A | 12/1996 | Coffey et al. |
| 5,640,343 A | 6/1997 | Gallagher et al. |
| 5,959,880 A | 9/1999 | Shi et al. |
| 6,191,973 B1 | 2/2001 | Moyer |
| 6,269,016 B1 | 7/2001 | Moyer |
| 6,304,477 B1 | 10/2001 | Naji |
| 6,317,349 B1 | 11/2001 | Wong |
| 6,385,082 B1 | 5/2002 | Abraham et al. |
| 6,532,164 B2 | 3/2003 | Redon et al. |
| 6,535,416 B1 | 3/2003 | Daughton et al. |
| 6,603,677 B2 | 8/2003 | Redon et al. |
| 6,693,822 B2 | 2/2004 | Ito |

(Continued)

FOREIGN PATENT DOCUMENTS

EP   1 225 593 A1   7/2002

(Continued)

OTHER PUBLICATIONS

EP Search Report, Application No. 09160167.4-1233, Aug. 28, 2009.

(Continued)

*Primary Examiner* — Pho M Luu
(74) *Attorney, Agent, or Firm* — Pearne & Gordon LLP (57) ABSTRACT

A magnetic tunnel junction (MTJ)-based magnetic random access memory (MRAM) cell with a thermally assisted switching (TAS) writing procedure and methods for manufacturing and using same. The TAS MTJ-based MRAM cell includes a magnetic tunnel junction that is formed with an anisotropic shape and that comprises a ferromagnetic storage layer, a reference layer, and an intermediate insulating layer. The ferromagnetic storage layer has a magnetization that is adjustable above a high temperature threshold; whereas, the reference layer has a fixed magnetization. The ferromagnetic storage layer is provided with a magnetocrystalline anisotropy that is oriented essentially perpendicular to a long axis of the anisotropic shape of the magnetic tunnel junction. The TAS MTJ-based MRAM cell advantageously limits the effects of dispersion in the magnetic tunnel junction shape anisotropy coming from the fabrication process and features a lower power consumption when compared with conventional MTJ-based MRAM and TAS MTJ-based MRAM cells.

24 Claims, 5 Drawing Sheets

U.S. PATENT DOCUMENTS

| | | | |
|---|---|---|---|
| 6,724,674 B2 | 4/2004 | Abraham et al. | |
| 6,950,335 B2 | 9/2005 | Dieny et al. | |
| 6,954,375 B2 | 10/2005 | Ohmori | |
| 6,963,098 B2 | 11/2005 | Daughton et al. | |
| 7,012,832 B1 | 3/2006 | Sin et al. | |
| 7,129,555 B2 | 10/2006 | Nozieres et al. | |
| 7,154,798 B2* | 12/2006 | Lin et al. | 365/209 |
| 7,307,874 B2* | 12/2007 | Jeong et al. | 365/158 |
| 7,310,265 B2 | 12/2007 | Zheng et al. | |
| 7,508,699 B2* | 3/2009 | Hwang et al. | 365/158 |
| 7,518,897 B2 | 4/2009 | Nozieres et al. | |
| 2002/0057593 A1 | 5/2002 | Hidaka | |
| 2003/0012063 A1 | 1/2003 | Chien | |
| 2004/0095801 A1 | 5/2004 | Stipe | |
| 2004/0160809 A1 | 8/2004 | Lin et al. | |
| 2005/0002228 A1 | 1/2005 | Dieny et al. | |
| 2005/0195658 A1 | 9/2005 | Sousa et al. | |
| 2006/0062044 A1* | 3/2006 | Jeong et al. | 365/158 |
| 2006/0291276 A1 | 12/2006 | Nozieres et al. | |
| 2008/0084724 A1 | 4/2008 | Nozieres et al. | |

FOREIGN PATENT DOCUMENTS

| | | |
|---|---|---|
| EP | 1 321 943 A | 6/2003 |
| EP | 1 507 266 A | 2/2005 |
| EP | 1 580 748 A | 9/2005 |
| EP | 2 109 111 A1 | 10/2009 |
| FR | 2 817 998 A1 | 6/2002 |
| FR | 2 817 999 A1 | 6/2002 |
| FR | 2 829 867 A1 | 3/2003 |
| FR | 2 829 868 A1 | 3/2003 |
| FR | 2 832 542 A1 | 5/2003 |
| WO | WO 03/025942 A2 | 3/2003 |
| WO | WO 03/025946 A1 | 3/2003 |
| WO | WO 03/043017 A2 | 5/2003 |
| WO | WO 2005/036559 A1 | 4/2005 |
| WO | WO 2005/086171 A1 | 9/2005 |
| WO | WO 2008/010957 A2 | 1/2008 |
| WO | WO 2008/040561 A3 | 4/2008 |

OTHER PUBLICATIONS

EP Examination Report, Application No. 07 818 777.0-2210, Aug. 4, 2009.

Purnama, Budi, et al., "Micromagnetic Simulation of Thermally Assisted Magnetization Reversal in Magnetic Nanodots with Perpendicular Anisotropy," Journal of Magnetism and Magnetic Materials, 310 (2007) pp. 2683-2685.

US, Notice of Allowance and Fees Due, Jan. 2, 2009.

EPO, International Search Report, Apr. 10, 2008.

Saito, Y., et al, Bias Voltage and Annealing-Temperature Dependences of Magnetoresistive Ratio IR-MN Exchange-Biased Double Tunnel Junctions, Journal of Magnetism and Magnetic Materials 223, (2001), pp. 293-298.

* cited by examiner

PRIOR ART

Fig. 1

PRIOR ART

MAGNETIC RANDOM ACCESS MEMORY WITH AN ELLIPTICAL MAGNETIC TUNNEL JUNCTION

CROSS-REFERENCE TO RELATED APPLICATIONS

This application claims priority to European patent application, Serial No. EP08290468.1, filed on May 20, 2008. Priority to the European application is expressly claimed, and the disclosure of which is hereby incorporated herein by reference in its entirety.

FIELD

The present disclosure relates to magnetic memories, especially non-volatile random-access magnetic memories used to store and read data in electronic systems. More particularly, the present disclosure relates to Magnetic Random Access Memories, referred to as MRAM, based on magnetic tunnel junctions and an improvement of the shape of the memory cell used in a tunnel junction based MRAM using a thermally assisted write scheme.

BACKGROUND

Magnetic random access memories (MRAMs) have been the object of a renewed interest with the discovery of magnetic tunnel junctions (MTJ) having a strong magnetoresistance at ambient temperature. These MRAMs present many advantages such as speed (a few nanoseconds of duration of writing and reading), nonvolatility, and insensitivity to ionizing radiation. Consequently, they are increasingly replacing memory that uses more conventional technology based on the charge state of a capacitor (DRAM, SRAM, FLASH).

In conventional MTJ based MRAM, the memory cell includes a magnetic tunnel junction that comprises a stack of several alternatively magnetic and non-magnetic metallic layers. Examples of conventional MTJ-based MRAM devices are described in U.S. Pat. No. 5,640,343. In their simplest forms, the magnetic tunnel junctions of MTJ-based MRAM are formed from two magnetic layers of different coercivity that are separated by an insulating thin layer. The first layer (or reference layer) of the magnetic tunnel junction is characterized by a fixed magnetization; whereas, the second layer (or storage layer) is characterized by a magnetization direction that can be changed. When the respective magnetizations of the reference layers and the storage layer are antiparallel, the resistance of the magnetic tunnel junction is high. On the other hand, when the respective magnetizations are parallel, the resistance of the magnetic tunnel junction becomes low.

Preferentially, the reference layer and the storage layer are made of 3d metals such as Fe, Co or Ni or their alloys. Eventually, boron can be added in the layer composition in order obtain an amorphous morphology and a flat interface. The insulating layer typically comprises alumina ($Al_2O_3$) or magnesium oxide (MgO). Preferentially, the reference layer itself can be formed from several layers as described, for instance, in U.S. Pat. No. 5,583,725, in order to form a synthetic antiferromagnetic layer. A double tunnel junction as described in the paper by Y. Saito et al., Journal of Magnetism and Magnetic Materials Vol. 223 (2001), p. 293, can also be used. In this case, the storage layer is sandwiched between two thin insulating layers with respective reference layers located on the opposite sides of the thin insulating layers.

Figure 1:
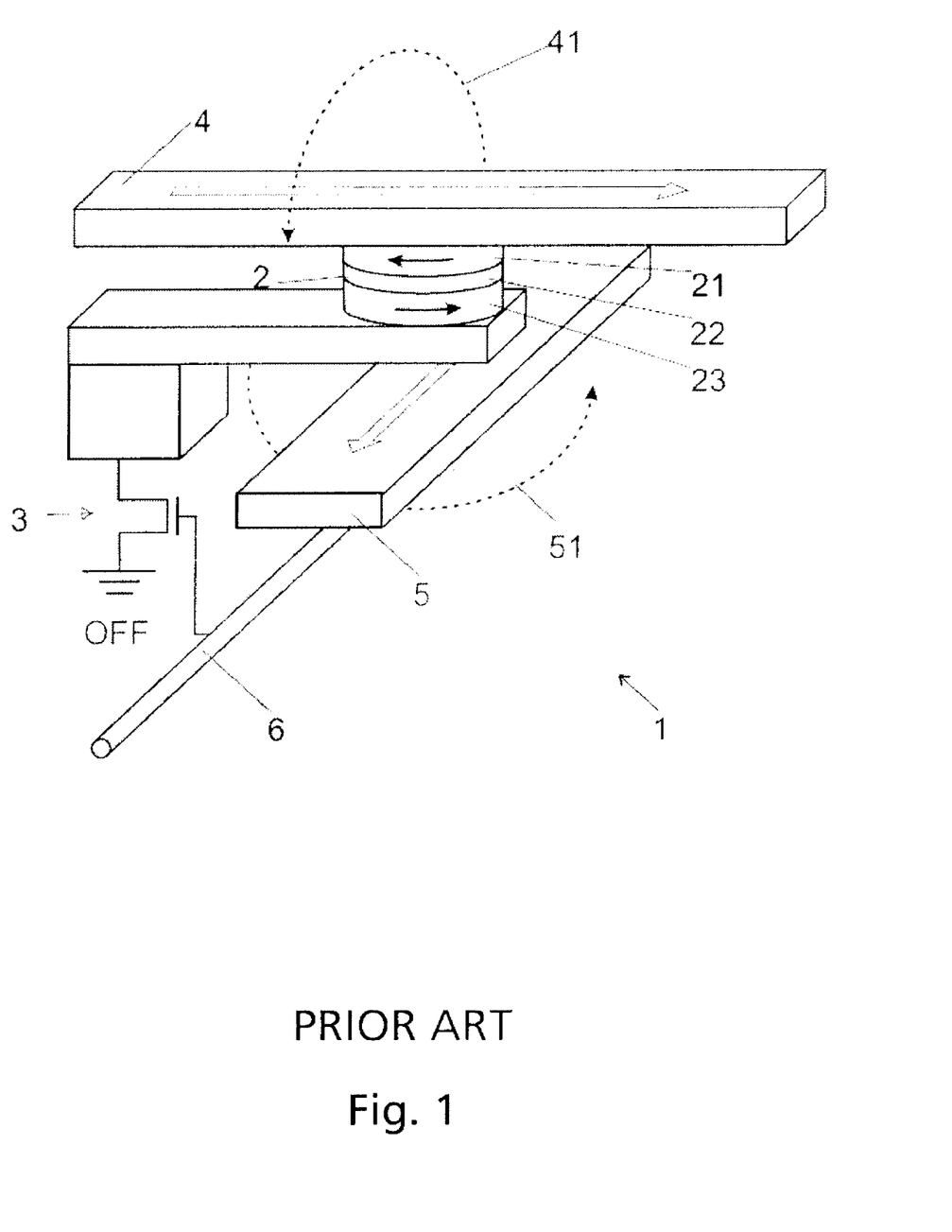
FIG. 1 shows a schematic view of a conventional magnetic tunnel junction (MTJ)-based magnetic random access memory (MRAM) cell.

FIG. 1 shows a memory cell 1 of a conventional MTJ-based MRAM. The memory cell 1 includes a magnetic tunnel junction 2 that comprises a storage layer 21, an insulating layer 22 and a reference layer 23. The magnetic tunnel junction 2 is illustrated as being disposed between a selection CMOS transistor 3 and a word current line 4. A bit current line 5 is placed orthogonal with the word current line 4. When electrical currents flow in the word and bit current lines 4, 5, word and bit magnetic fields 41 and 51 are respectively produced. Electrical currents are typically short current pulses from 2 to 5 nanoseconds having a magnitude on the order of 10 mA. An additional control current line 6 is applied to control the opening and/or the closing of the transistor 3 to address each memory cell 1 individually.

During a writing process, the transistor 3 is in the blocked mode (OFF), and no current flows through the magnetic tunnel junction 2. The intensity of the current pulses and their synchronization are adjusted so that only the magnetization of the storage layer 21 located at the crossing of the word and bit current lines 4, 5 can switch under the combined effect of the word and bit magnetic fields 41 and 51.

During a reading process, the transistor 3 is in the saturated mode (ON) and a junction current will flows through the magnetic tunnel junction 2 allowing the measurement of the junction resistance of the memory cell 1. The state of the memory cell 1 is determined by comparing the measured resistance with the resistance of a reference memory cell. For example, a low junction resistance will be measured when the magnetization of the storage layer 21 is parallel to the magnetization of the reference layer 23 corresponding to a value of "0." Conversely, a magnetization of the storage layer 21, antiparallel to the magnetization of the reference layer 23, will yield a high junction resistance corresponding to a value of "1."

Basic structural details for this type of conventional MTJ-based MRAM are described in U.S. Pat. Nos. 4,949,039 and 5,159,513; while, U.S. Pat. No. 5,343,422 discloses an implementation of a random-access memory (RAM) based on a MTJ based MRAM structure.

To help ensure that this architecture is working properly during the writing process, it is necessary to use memory cells 1 with an anisotropic form having high aspect ratios, typically 1.5 or more. Such geometry is required to obtain bi-stable functioning of the memory cell 1, a good writing selectivity between the selected memory cell and the half-selected cells located on the same line/column, and good thermal/temporal stability of the information.

According to U.S. Pat. No. 5,959,880, the aspect ratio of a memory cell can be reduced by increasing the magnetocrystalline anisotropy of the material that forms the storage layer. By doing this, the system is stable in time and temperature, and both states of the memory cell are well defined. On the other hand, the writing field required to reverse the magnetization of the memory cell from one stable state to another is significant and therefore the power consumed during the writing process is large. Conversely, if the magnetocrystalline anisotropy is low, the power consumed at writing is also low, but thermal and temporal stability of the storage layer are no more ensured. In other words, U.S. Pat. No. 5,959,880 teaches that it is not possible to simultaneously ensure low power consumption and thermal and temporal stability.

A thermally assisted writing switching (TAS) process for the above-referenced MTJ-based MRAM structure is described in United States Patent Application Publication No. US 2005/0002228 A1. The particularity of the magnetic tunnel junction of the TAS MTJ based MRAM is that both the reference layer and the storage layer are exchange biased.

More precisely, the reference and storage layers are pinned by interaction with an adjacent antiferromagnetic reference layer and antiferromagnetic storage layer respectively. During a thermally assisted writing process, for example, a junction current pulse is sent through the magnetic tunnel junction rising the temperature of the magnetic tunnel junction and the magnetic coupling between the ferromagnetic storage layer and antiferromagnetic storage layer disappears. The magnetic tunnel junction is then cooled while a moderate magnetic field is applied by making a current to flow in the word current line, allowing for the reversal of the magnetization of the storage layer.

In contrast with the conventional MTJ-based MRAM, the TAS MTJ based MRAM structure is characterized by a considerably improved thermal stability of the storage layer due to the pinning of the antiferromagnetic storage layer. An improved writing selectivity is also achieved due to the selective heating of the memory cell to be written in comparison with the neighboring memory cells remaining at ambient temperature. The TAS MTJ-based MRAM structure also allows for a higher integration density without affecting its stability limit, and reduced power consumption during the writing process since the power required to heat the memory cell is less than the one needed to generate magnetization in the conventional MTJ-based MRAM structure.

A further improvement of the TAS MTJ-based MRAMs in terms of power consumption has been described in United States Patent Application Publication No. US 2006/0291276 A1. Here, the writing field is further reduced by selecting a circular geometry of the memory cell junction. In this case, the writing field is only given by the magnetocrystalline anisotropy of the storage layer and there is no contribution from the shape anisotropy. However, the use of a circular geometry does not allow for simultaneously low power consumption and thermal and temporal stability of the storage layer.

The benefit of using a circular magnetic tunnel junction can be better understood by expressing the energy of the magnetic barrier height that has to be overcome to write the cell from a state "0," of low electrical resistance, to a state "1," of high electrical resistance. The barrier energy per volume unit, $E_b$, can be expressed as set forth in Equation 1.

$$E_b = K + \frac{AR-1}{L} t M_s^2 \qquad \text{(Equation 1)}$$

In Equation 1, the first term, K, is the magnetocrystalline anisotropy and the second term corresponds to the shape anisotropy. In the second term, AR is the aspect ratio of the magnetic tunnel junction, defined as the ratio of the length to the width L of the magnetic tunnel junction; t is the thickness of the storage layer; and $M_s$ its saturation magnetization. The ellipticity can be defined as (AR−1), expressed in percentage terms.

The limitations of the prior art can be understood by considering that the barrier energy $E_b$ increases with decreasing the size of the magnetic tunnel junction (L decreases and AR is constant), resulting in a significant increase in power consumption. In the other hand, the barrier energy $E_b$ decreases with decreasing AR (L being constant), resulting in a loss of thermal and temporal stability.

In the case of a TAS MTJ-based MRAM with an exchange-biased storage layer, the storage layer stability at working temperatures is ensured by the pinning of the ferromagnetic storage layer with the antiferromagnetic layer, while, at writing temperatures, the pinning disappears and the memory cell can be written with a low writing field. In the case of a circular cell junction, a low writing field is obtained only by the low magnetocrystalline anisotropy. A low writing field and good thermal stability can then be obtained simultaneously by combining the junction geometry with the TAS MTJ-based MRAMs.

Figure 2:
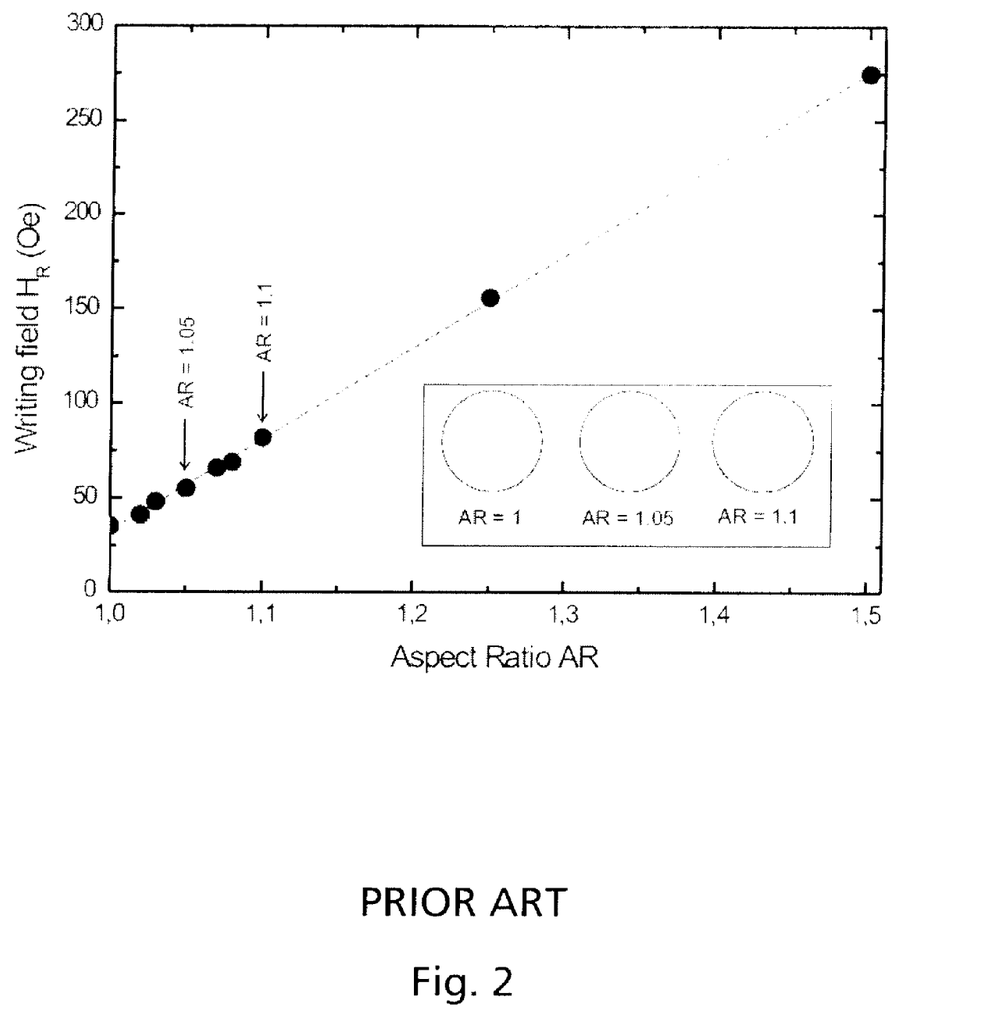
FIG. 2 shows a dependence of the writing field of the storage layer on the aspect ratio of the magnetic tunnel junction for the TAS MTJ-based MRAM cell of FIG. 1.

However, usual MRAM fabrication processes cannot guarantee perfectly circular magnetic tunnel junctions over a large array of memory cells, due to, for example, accuracy limitations in the pattering of the different junction layers. In addition, the magnitude of writing fields is strongly dependant on variations in the junction ellipticity. FIG. 2 shows the dependence of the writing field $H_R$ of the storage layer, on the aspect ratio of the magnetic tunnel junction for a conventional TAS MTJ-based MRAM cell. For example, the magnitude of the writing field more than doubles when the junction aspect ratio is increased from AR=1.0 to 1.1, representing a 10% variation typical from a usual fabrication process. The inset of FIG. 2 shows a top view of magnetic tunnel junctions with aspect ratio comprised between 1.0 and 1.1.

Such a variation of the aspect ratio results in a large dispersion of the writing field and a significant increase of the power consumption in a magnetic memory device containing an array of memory cells with circular junctions. In addition, electromigration effects in the current lines that occur for large electrical currents at high writing field may not be avoided.

SUMMARY

The disclosed magnetic tunnel junction (MTJ)-based magnetic random access memory (MRAM) cell with a thermally assisted switching (TAS) writing procedure advantageously provides a reduced dependence of the dispersion of the writing field on the junction aspect ratio due to the fabrication process.

As illustrated by the preferred embodiments, the TAS MTJ-based MRAM cell can include a magnetic tunnel junction. The magnetic tunnel junction can be formed from a ferromagnetic storage layer, a reference layer, and an insulating layer that is disposed between the storage and reference layers. The ferromagnetic storage layer can have a magnetization that is adjustable above a high temperature threshold; whereas, the reference layer can be provided with a fixed magnetization. Preferably, the magnetic tunnel junction is formed with an anisotropic shape, and a magnetocrystalline anisotropy of the ferromagnetic storage layer can be oriented essentially perpendicular to a long axis of the anisotropic shape of the magnetic tunnel junction. In one embodiment, the magnetocrystalline anisotropy of the ferromagnetic storage layer and the long axis of the anisotropic shape of the magnetic tunnel junction can form an angle within a preselected range, such as within a range between eighty degrees (80°) and ninety degrees (90°), inclusive.

The magnetic tunnel junction can be formed with any suitable anisotropic shape and/or dimension, such as an aspect ratio. In one illustrative embodiment, for example, the anisotropic shape of the magnetic tunnel junction can comprise an elliptical shape, a rectangle shape, a crescent shape, a semi-ellipse shape, and/or a diamond shape without limitation. In another illustrative embodiment, the magnetic tunnel junction can have an anisotropic shape with an aspect ratio comprised between approximately 1.0 and 1.5. For instance, the aspect ratio of the magnetic tunnel junction can be comprised within a first range between 1.0 and 1.1 and/or a second range between 1.0 and 1.05.

The present application likewise discloses a method of writing data in the TAS MTJ-based MRAM cell, the cell further comprising a select transistor being coupled with the magnetic tunnel junction and controllable via a word line, a connecting current line electrically connected to the magnetic tunnel junction, and a word current line; the method comprising:

heating the magnetic tunnel junction until it has reached a high temperature threshold;

aligning the magnetization of the ferromagnetic storage layer in a direction essentially parallel or antiparallel with the magnetization orientation of the reference layer; and cooling down the magnetic tunnel junction to a low temperature threshold at which the magnetization of the ferromagnetic storage layer is pinned.

In the context of the patent application, the expressions "ellipse," "elliptical," and "ellipticity" generally refer to any closed shapes having an anisotropic form such as ellipses, crescents, semi-ellipses, diamonds, rectangles, etc.

Advantages of the TAS MTJ-based MRAM cell comprise limiting the effects of dispersion in the magnetic tunnel junction shape anisotropy coming from the fabrication process, a lower power consumption, and facilitated cell scaling down, compared with the MTJ-based MRAM and TAS MTJ-based MRAM cells of the prior art.

BRIEF DESCRIPTION OF THE DRAWINGS

The preferred embodiments will be better understood with the aid of the description of an embodiment given by way of example and illustrated by the figures, in which.

DETAILED DESCRIPTION OF THE PREFERRED EMBODIMENTS

Figure 3:
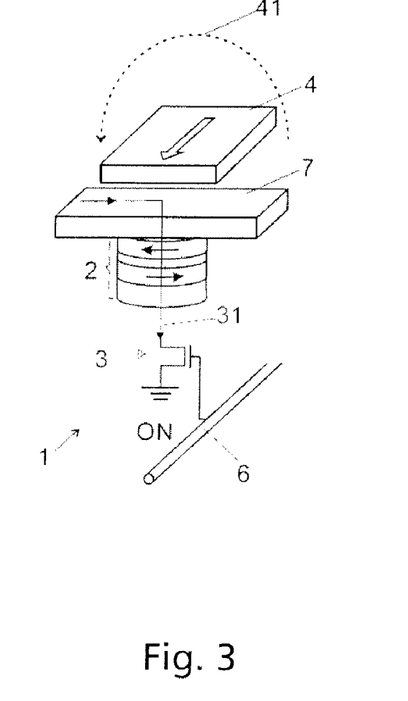
FIG. 3 illustrates an embodiment of a TAS MTJ-based MRAM cell comprising an exemplary magnetic tunnel junction.

FIG. 3 illustrates one embodiment of a thermally assisted switching (TAS) magnetic tunnel junction (MTJ)-based magnetic random access memory (MRAM) memory cell 1. The TAS MTJ-based MRAM cell 1 comprises a magnetic tunnel junction 2 placed between a selection CMOS select transistor 3 and a connecting current line 7 for passing a junction current pulse 31 flowing through the magnetic tunnel junction 2 when the transistor 3 is in the saturated or open mode (ON). A control current line 6 is used to control the opening and the closing of the transistor 3 to address each memory cell individually. The TAS MTJ-based MRAM cell 1 also comprises a word current line 4, shown above and perpendicular to the connecting current line 7 in the example of FIG. 3. Other configurations of the word current line 4 are however possible. For example the word current line 4 can be placed parallel with the connecting current line 7 and/or on the side of or below the magnetic tunnel junction 2.

Figure 4:
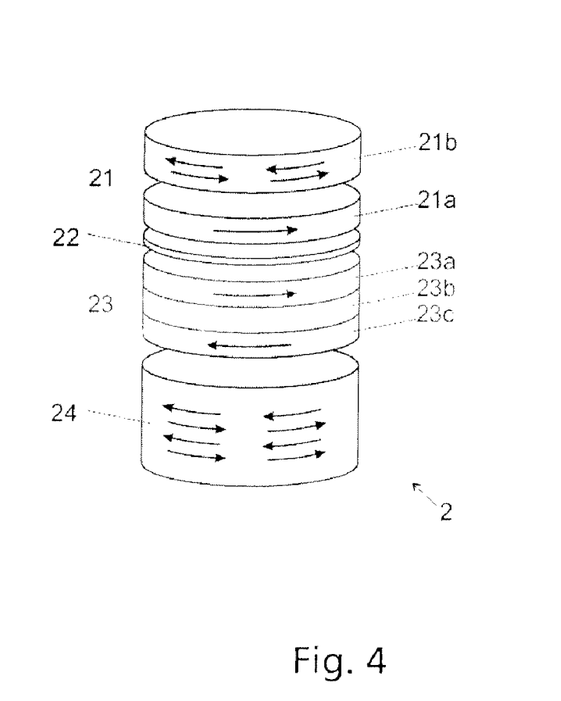
FIG. 4 illustrates an exploded view of the exemplary magnetic tunnel junction of the TAS MTJ-based MRAM cell of FIG. 3.

An exploded view on the exemplary magnetic tunnel junction 2 is shown in FIG. 4. The magnetic tunnel junction 2 contains a storage layer 21 preferably comprising a ferromagnetic storage layer 21a and an antiferromagnetic storage layer 21b. The ferromagnetic storage layer 21a has a thickness typically of the order of 1 to 10 nm and is made of a material having a planar magnetization, typically selected from the group Permalloy ($Ni_{80}Fe_{20}$), $CO_{90}Fe_{10}$ or other alloys containing Fe, Co or Ni. The ferromagnetic storage layer 21a is exchange-coupled by the antiferromagnetic storage layer 21b made of a manganese-based alloy, for example, of IrMn or FeMn. The antiferromagnetic storage layer 21b has a blocking temperature $T_{BS}$ sufficiently high to ensure that at a low temperature threshold below $T_{BS}$, for example, at standby temperature, i.e., in the absence of heating, magnetization of the ferromagnetic storage layer 21a is sufficiently pinned to be able to preserve its magnetization over a period of several years but not so high as to make it necessary to heat the magnetic tunnel junction 2 excessively during every the writing process that could yield to material degradation and high power consumption. Here, a $T_{BS}$ in the range of, for example, 120 to 220° C. is suitable.

The magnetic tunnel junction 2 also contains a reference layer 23 preferably comprising a first ferromagnetic reference layer 23a and a second ferromagnetic reference layer 23c, both formed of a Fe, Co or Ni based alloy. The two ferromagnetic reference layers 23a, 23c are antiferromagnetically coupled by inserting between them a non-ferromagnetic reference layer 23b made, for example, of ruthenium. An antiferromagnetic reference layer 24, preferably formed of a Mn based alloy such as PtMn or NiMn and characterized by a blocking temperature $T_{BR}$ higher than $T_{BS}$, is provided below the second ferromagnetic reference layer 23c. The antiferromagnetic reference layer 24 orients the magnetic moment of the first ferromagnetic reference layer 23a, and a pinning field is generated that fixes the magnetic moment of the second ferromagnetic reference layer 23c. The reference layer structure described above is well known in the state of the art under the name of synthetic antiferromagnet pinned layer. Other configurations of the storage layer 23 are also possible. For example, the reference layer 23 can comprise a single ferromagnetic reference layer pinned by the antiferromagnetic reference layer 24 described above.

An insulating layer 22 playing the role of a tunnel barrier and preferably made of a material selected from the group comprising $Al_2O_3$ and MgO is inserted between the storage layer 21 and the reference layer 23. The tunneling resistance of a magnetic tunnel junction 2 depends exponentially on the insulating layer thickness and is measured by the resistance-area product (RA) of the magnetic tunnel junction 2. The RA should be sufficiently small to flow the junction current 31 through the magnetic tunnel junction 2, sufficiently high to raise the temperature of the antiferromagnetic storage layer 21b above its blocking temperature $T_{BS}$. In order to force a current density in the range of $10^5$ $A/cm^2$ to $10^7$ $A/cm^2$, typically required to raise the temperature of the magnetic tunnel junction 2 up to 100° C., the RA value should be of the order of 1 to 500 $\Omega \cdot \mu m^2$.

In another embodiment, the magnetic tunnel junction 2, at least one thermal barrier layer (not shown) made typically of BiTe or GeSbTe and having a very low thermal conductivity can be added at the top and at the bottom of the magnetic tunnel junction 2. The purpose of these additional layers is to increase the heating efficiency of the junction current 31 flowing through the magnetic tunnel junction 2 while limiting the diffusion of the heat towards the electrode (not shown) ensuring the electrical connection between the magnetic tunnel junction 2 and the connecting current line 7. Here, the thermal barrier itself is electrically connected to the electrode directly or via a conductive layer, for example made of TiN or TiWN.

During the thermally assisted writing process, the junction current pulse 31 having a magnitude comprised between $10^5$ A/cm$^2$ and $10^7$ A/cm$^2$ and lasting several nanoseconds is sent through a connecting current line 7 and the magnetic tunnel junction 2 (with transistor ON), rising the temperature of the magnetic tunnel junction 2 to a high temperature threshold of about 120 to 220° C., lying between $T_{BS}$ and $T_{BR}$ where the magnetic coupling between the ferromagnetic storage layer 21a and antiferromagnetic storage layer 21b disappears and the magnetization of the ferromagnetic storage layer 21a, being no more pinned, can be freely adjusted. The magnetic tunnel junction 2 is then cooled while a moderate word magnetic field 41 is applied by flowing a current in the word current line 4, allowing for the aligning of the magnetization of the ferromagnetic storage layer 21a in a direction according to the magnetic field 41 orientation, essentially parallel or antiparallel with the magnetization orientation of the reference layer 23. The magnetic tunnel junction 2 is then cooled down at a low temperature threshold below the blocking temperature $T_{BS}$ of the antiferromagnetic storage layer 21b, where the magnetization of the ferromagnetic storage layer 21a becomes pinned in its reversed direction, or written state.

The magnetic tunnel junction 2 preferably has an anisotropic shape, such as an elliptical shape, and the ferromagnetic storage layer 21a has a magnetocrystalline anisotropy that is oriented essentially perpendicular to the long axis of the anisotropic shape of the magnetic tunnel junction 2. In other words, in the TAS MTJ-based MRAM cell 1, the magnetization of the ferromagnetic storage layer 21a is oriented in a direction that is essentially perpendicular with the long axis, or easy axis, of the anisotropic shape of the magnetic tunnel junction 2 at a high temperature threshold, when the magnetization of the ferromagnetic storage layer 21a can be freely adjusted. In one embodiment, the anisotropic shape of the magnetic tunnel junction 2 can have an irregular shape with a long axis that may not be well defined such that the long axis of the anisotropic shape may be not be strictly perpendicular to the magnetocrystalline anisotropy. Accordingly, the magnetocrystalline anisotropy of the ferromagnetic storage layer and the long axis of the anisotropic shape of the magnetic tunnel junction 2 can form an angle within a preselected range, such as within a range between eighty degrees (80°) and ninety degrees (90°), inclusive. In other words, the term "perpendicular" (or "perpendicularly") as used herein can generally refer to forming an angle within the preselected range.

Figure 5:
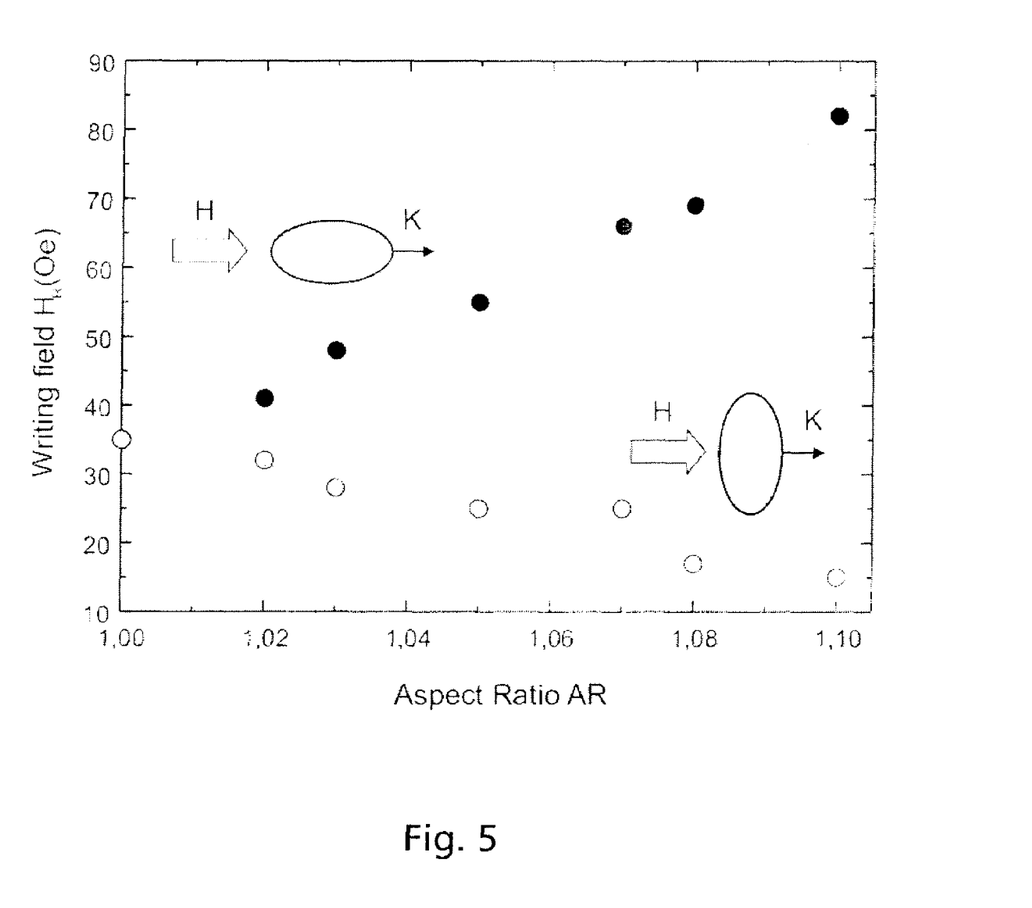
FIG. 5 illustrates an exemplary variation of the writing field with the magnetic tunnel junction aspect ratio for a magnetocrystalline anisotropy axis of the ferromagnetic storage layer being parallel and perpendicular to the long axis of the magnetic tunnel junction.

An advantage of using such a magnetic tunnel junction geometry and magnetocrystalline orientation can be seen from the variation in the writing (or coercive) field, $H_R$, of the ferromagnetic storage layer 21a with the junction aspect ratio. FIG. 5 compares the variation of the word magnetic field 41, or writing field $H_R$, with the junction aspect ratio AR for a conventional memory cell, where the ferromagnetic storage layer 21a has a magnetocrystalline anisotropy axis parallel to the long axis of the ellipse (filled circles), and for the memory cell 1, where the ferromagnetic storage layer 21a has a magnetocrystalline anisotropy axis perpendicular to the long axis of the ellipse (open circles). Here, the variation of the writing field $H_R$ has been calculated for the junction anisotropic shapes having aspect ratios AR comprised between 1.0 and 1.1. The calculations were performed by means of micromagnetic simulations assuming standard material parameters corresponding to the ferromagnetic storage layer 21a employed in a usual TAS MTJ-based MRAM cell 1 and assuming that the writing field $H_R$ is applied parallel to the magnetocrystalline anisotropy axis. The calculations also assumed that the writing field $H_R$ is not influenced by the dispersion in ellipticity and is essentially given by the magnetocrystalline anisotropy value corresponding, for example, to the writing field of a circular junction (AR=1.0).

The shape of the magnetic tunnel junction 2 is not limited to an elliptical shape but can have any shape that is anisotropic, such as a rectangle, crescent, semi-ellipse, diamond, etc., where the magnetocrystalline anisotropy axis is essentially perpendicular to the long axis of the anisotropic shape of the magnetic tunnel junction 2.

As can be seen in FIG. 5, the writing field $H_R$ increases approximately linearly with the memory cell aspect ratio AR, for a magnetocrystalline anisotropy axis of the ferromagnetic storage layer 21a that is essentially parallel to the long axis of the ellipse. In this case, a variation in the memory cell aspect ratio AR due to the manufacturing process will result in an overall increase in the writing field $H_R$ and a larger power consumption of the magnetic memory device. Conversely, in the case of a magnetocrystalline anisotropy being essentially perpendicular to the long axis of the ellipse, the writing field $H_R$ decreases approximately linearly with the aspect ratio AR, and a variation in the memory cell aspect ratio AR will tend to diminish the overall writing field $H_R$ and power consumption of the magnetic memory cell 1.

In a preferred embodiment, the magnetic tunnel junction 2 of the memory cell is characterized by an aspect ratio AR equal or above a value of 1.0, corresponding to a circular (or square, etc.) magnetic tunnel junction 2, but preferably comprised between 1.0 and 1.5, and a magnetocrystalline anisotropy axis of the ferromagnetic storage layer 21a perpendicular to the long axis of the ellipse.

A magnetic memory device (not represented) can be formed by assembling a matrix comprising a plurality of TAS MTJ-based MRAM cells 1, where each magnetic tunnel junction 2 of each memory cell 1 is connected on the side of the storage layer 21, or ferromagnetic storage layer 21a, to the connecting current line 7, and on the opposite side to the control current line 6, placed perpendicular with the connecting current line 7. When one of the memory cells 1 is to be written, a current pulse is sent in one or several control lines 6 to put at least one of the transistors 3 of the corresponding control lines 6 in mode ON, and a junction current pulse 31 is sent to each connecting lines 7 corresponding to the memory cells 1 to be written, i.e., the memory cells 1 placed at the intersection of the active connecting current lines 7 and active control lines 6.

Using today's lithographic fabrication processes a maximal variation, $\Delta_c$, in the shape anisotropy of the magnetic tunnel junction 2 of about ±5% can be typically obtained. This corresponds, for example, to an aspect ratio AR of the magnetic tunnel junction 2 varying from 1.0 to 1.1 with an average aspect ratio of 1.05, for the memory cells 1 of the magnetic memory device. In the exemplary calculations of FIG. 5, an anisotropic shape with an aspect ratio AR of 1.05 corresponds to a writing field $H_R$ of about 25 Oe, for the TAS MTJ-based MRAM cell 1. This represents a decrease of about 30% in the writing field value compared to the one calculated for a magnetic tunnel junction 2 with an aspect ratio AR of 1.

In a preferred embodiment, the magnetic tunnel junction 2 of the memory cell 1 has an aspect ratio AR comprised within the maximum shape anisotropy variations allowed by the fabrication process used for the memory cell fabrication, and has a magnetocrystalline anisotropy axis of the ferromagnetic storage layer 21a perpendicular to the long axis of the magnetic tunnel junction anisotropic shape. For example, the magnetic tunnel junction 2 of the memory cell 1 has an aspect ratio AR comprised between 1.0 and 1.1.

Continuous improvements in the fabrication processes may equally allow for smaller variations in the aspect ratio AR of the magnetic tunnel junctions 2 within the memory device. For example, using such advanced fabrication technologies, the magnetic tunnel junction 2 of the memory cell 1 could be characterized by an aspect ratio AR comprised between 1.0 and 1.05, or even smaller.

Figure 6:
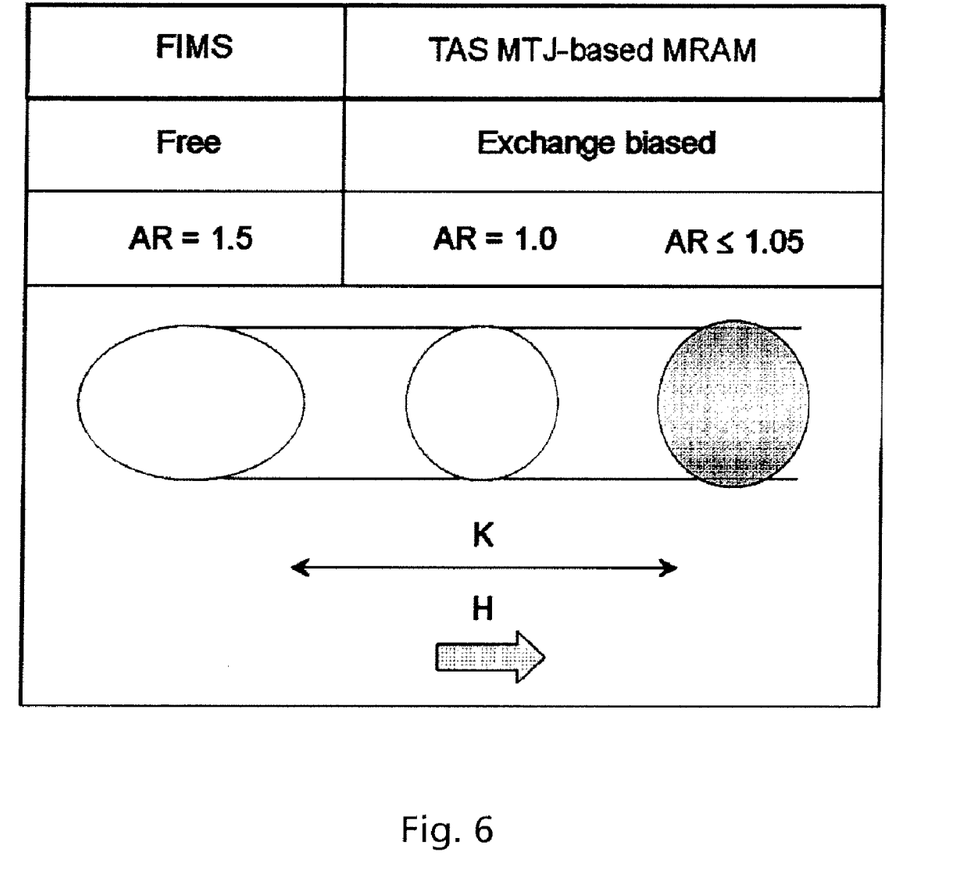
FIG. 6 illustrates a top view of a conventional magnetic tunnel junction with an aspect ratio of 1.5, and two magnetic tunnel junctions with aspect ratios of 1.0 and 1.05 respectively.

FIG. 6 compares schematically the top view of a conventional magnetic tunnel junction 2 with a field induced magnetic switching (FIMS) architecture having an aspect ratio AR of 1.5, with two magnetic tunnel junctions 2 of the TAS MTJ-based MRAM cell 1 having aspect ratios AR of 1.0 and 1.05 respectively.

In another embodiment, the variation of the junction aspect ratio AR is minimized by using an appropriate fabrication process and/or by a careful control of the fabrication process and/or by selecting fabricated memory cells 1 having the least variation possible in their aspect ratio AR. Here, the magnetic memory device containing such magnetic tunnel junctions 2 with an aspect ratio AR of about 1.0 or any other value, can be fabricated with no or a very small dispersion in the aspect ratio AR. Such memory device can have minimal variations of the writing field $H_R$ due to the combined effect of the small or inexistent dispersion, in the junction aspect ratios AR, and in the magnetocrystalline anisotropy axis of the ferromagnetic storage layer 21a being essentially perpendicular to the long axis of the anisotropic shape of the magnetic tunnel junctions 2.

In yet another embodiment, the magnetic tunnel junctions 2 of the memory device have a magnetocrystalline anisotropy axis of the ferromagnetic storage layer 21a essentially parallel to the long axis of the junction anisotropic shape, the latter having a very small or no dispersion of the aspect ratio AR.

The fact that the magnetocrystalline anisotropy axis of the ferromagnetic storage layer 21a is perpendicular to the long axis of the anisotropic shape of the magnetic tunnel junction 2, gives rise to a competition between the magnetocrystalline anisotropy and shape anisotropy terms of the barrier energy, $E_b$. For example, in the absence of an external applied magnetic field, the magnetic moments of the ferromagnetic storage layer 21a may be tilted with respect to the magnetic moments of the reference layer 23. This tilt can increase with increasing aspect ratios AR, translating in an important dispersion in the resistance value during the reading operation, and resulting in a loss in the read margin that corresponds to the difference between low and high resistance states.

With the TAS MTJ-based MRAM cell 1, however, the writing sequence comprises a last cooling stage of the magnetic tunnel junction 2, performed under the word magnetic field 41, corresponding to the writing field $H_R$. This word magnetic field 41 "freezes" the magnetic state of the ferromagnetic storage layer 21a resulting in a much reduced tilt of the magnetic moments of the ferromagnetic storage layer 21a with respect to the reference layer 23, yielding to a much lesser influence in the read margin. For example, a loss of less than 20% for the read margin is expected in the case of the magnetic tunnel junction 2 with a shape anisotropy variation of 10%.

The disclosed embodiments are susceptible to various modifications and alternative forms, and specific examples thereof have been shown by way of example in the drawings and are herein described in detail. It should be understood, however, that the disclosed embodiments are not to be limited to the particular forms or methods disclosed, but to the contrary, the disclosed embodiments are to cover all modifications, equivalents, and alternatives.

For example, other configurations of the TAS MTJ-based MRAM cell 1 can be used in the context provided the magnetic tunnel junction 2 is fabricated with an isotropic (circular, square, etc.) or anisotropic (elliptical, rectangular, etc.) geometry and has a magnetocrystalline anisotropy axis of the ferromagnetic storage layer 21a, essentially parallel to the long axis of the anisotropic shape of the magnetic tunnel junction 2. An example of another TAS MTJ-based MRAM cell 1 configuration is the memory cell described in unpublished European patent application Serial No. EP07291520 by the present applicant, where the magnetic tunnel junction 2 comprises a writing layer added on top of the storage layer 21. Another example is the magnetic tunnel junction described in the above-referenced United States Patent Application Publication No. US 2005/0002228 A1 of a general thermally assisted MRAM architecture, where the writing process is ensured by the combination of one magnetic field and a local heating, and the storage layer is exchanged biased with an antiferromagnetic layer.

REFERENCE NUMBERS 1 memory cell
2 magnetic tunnel junction
21 storage layer
21a ferromagnetic storage layer
21b antiferromagnetic storage layer
22 insulating layer
23 reference layer
23a first ferromagnetic reference layer
23b non-ferromagnetic reference layer
23c second ferromagnetic reference layer
24 antiferromagnetic reference layer
3 select transistor
31 junction current pulse
4 word current line
41 word magnetic field
5 bit current line
51 bit magnetic field
6 control current line
7 connecting current line

REFERENCE SYMBOLS

AR aspect ratio of the memory cell
AR-1 ellipticity of the memory cell
$E_b$ barrier energy
$H_R$ writing (coercive) field of the ferromagnetic storage layer
L width of the magnetic tunnel junction
$M_s$ saturation magnetization of the memory cell
RA resistance-area product of the insulating layer
t thickness of the storage layer
$T_{BS}$ blocking temperature of the antiferromagnetic storage layer
$T_{BR}$ blocking temperature of the antiferromagnetic reference layer
$\Delta_e$ maximal variation in the junction anisotropy

What is claimed is:

1. A magnetic tunnel junction (MTJ)-based magnetic random access memory (MRAM) cell with a thermally assisted switching (TAS) writing procedure, comprising:
   a magnetic tunnel junction having an anisotropic shape and being formed from a ferromagnetic storage layer having a magnetization that is adjustable above a high temperature threshold and a reference layer having a fixed magnetization; and
   an insulating layer being disposed between said storage and reference layers,
   wherein said ferromagnetic storage layer has a magnetocrystalline anisotropy that is oriented perpendicularly to a long axis of said anisotropic shape of said magnetic tunnel junction.

2. The TAS MTJ-based MRAM cell according to claim 1, wherein said anisotropic shape of said magnetic tunnel junction is selected from a group consisting of an elliptical shape, a rectangular shape, a crescent shape, a semi-elliptical shape, and a diamond shape.

3. The TAS MTJ-based MRAM cell according to claim 1, wherein said anisotropic shape of said magnetic tunnel junction has an aspect ratio that is within a range between 1.0 and 1.5.

4. The TAS MTJ-based MRAM cell according to claim 3, wherein said aspect ratio is within a predetermined range selected from a group of ranges consisting of a first range between 1.0 and 1.1 and a second range between 1.0 and 1.05.

5. The TAS MTJ-based MRAM cell according to claim 1, wherein said anisotropic shape of said magnetic tunnel junction has an aspect ratio of 1.05.

6. The TAS MTJ-based MRAM cell according to claim 1, wherein said magnetic tunnel junction further comprises an antiferromagnetic storage layer, said antiferromagnetic storage layer exchange-coupling said ferromagnetic storage layer, pinning the magnetization of said ferromagnetic storage layer below a low temperature threshold, and freeing the magnetization of said ferromagnetic storage layer above the high temperature threshold.

7. The TAS MTJ-based MRAM cell according to claim 1, wherein said reference layer comprises a single ferromagnetic reference layer being pinned by an antiferromagnetic reference layer.

8. The TAS MTJ-based MRAM cell according to claim 1, wherein said reference layer comprises a first ferromagnetic reference layer and a second ferromagnetic reference layer being antiferromagnetically coupled by a non-ferromagnetic reference layer, at least one of said first and second ferromagnetic reference layers being pinned by an antiferromagnetic reference layer.

9. The TAS MTJ-based MRAM cell according to claim 1, wherein said magnetocrystalline anisotropy of said ferromagnetic storage layer and said long axis of said anisotropic shape of said magnetic tunnel junction form an angle within a preselected range between eighty degrees and ninety degrees, inclusive.

10. A magnetic memory device formed from an array comprising a plurality of TAS-MRAM cells characterized by claim 1.

11. A magnetic tunnel junction suitable for use with a magnetic tunnel junction (MTJ)-based magnetic random access memory (MRAM) cell with a thermally assisted switching (TAS) writing procedure, comprising:
   a ferromagnetic storage layer having a magnetization that is adjustable above a high temperature threshold;
   a reference layer having a fixed magnetization; and
   an insulating layer being disposed between said storage and reference layers,
   wherein said ferromagnetic storage layer has a magnetocrystalline anisotropy that is oriented perpendicularly to a long axis of an anisotropic shape of the magnetic tunnel junction.

12. The magnetic tunnel junction according to claim 11, wherein the anisotropic shape is selected from a group consisting of an elliptical shape, a rectangular shape, a crescent shape, a semi-elliptical shape, and a diamond shape.

13. The magnetic tunnel junction according to claim 11, wherein the anisotropic shape has an aspect ratio that is within a range between 1.0 and 1.5.

14. The magnetic tunnel junction according to claim 13, wherein said aspect ratio is within a predetermined range selected from a group of ranges consisting of a first range between 1.0 and 1.1 and a second range between 1.0 and 1.05.

15. The magnetic tunnel junction according to claim 11, further comprising an antiferromagnetic reference layer that pins said reference layer.

16. The magnetic tunnel junction according to claim 15, wherein said reference layer comprises a single ferromagnetic reference layer that is pinned by said antiferromagnetic reference layer.

17. The magnetic tunnel junction according to claim 15, wherein said reference layer comprises a first ferromagnetic reference layer and a second ferromagnetic reference layer being antiferromagnetically coupled by a non-ferromagnetic reference layer, at least one of the first and second ferromagnetic reference layers being pinned by said antiferromagnetic reference layer.

18. The magnetic tunnel junction according to claim 11, further comprising an antiferromagnetic storage layer that exchange-couples said ferromagnetic storage layer, pins the magnetization of said ferromagnetic storage layer below a low temperature threshold, and frees the magnetization of said ferromagnetic storage layer above the high temperature threshold.

19. The magnetic tunnel junction according to claim 11, wherein said magnetocrystalline anisotropy of said ferromagnetic storage layer and said long axis of said anisotropic shape of said magnetic tunnel junction form an angle within a range between eighty degrees and ninety degrees, inclusive.

20. A method of writing data in a thermally assisted switching (TAS), magnetic tunnel junction (MTJ)-based magnetic random access memory (MRAM) cell comprising a magnetic tunnel junction, a select transistor coupled with the magnetic tunnel junction and controllable via a word line, a connecting current line electrically connected to the magnetic tunnel junction, and a word current line, the magnetic tunnel junction being provided with an anisotropic shape and including a ferromagnetic storage layer, a reference layer having a fixed magnetization, and an insulating layer being disposed between the storage and reference layers, the ferromagnetic storage layer having a magnetization that is adjustable above a high temperature threshold and a magnetocrystalline anisotropy that is oriented perpendicularly to a long axis of the anisotropic shape of the magnetic tunnel junction, comprising:
   heating the magnetic tunnel junction to the high temperature threshold;
   aligning the magnetization of the ferromagnetic storage layer relative to the fixed magnetization of the reference layer; and
   cooling the magnetic tunnel junction to a low temperature threshold at which the magnetization of the ferromagnetic storage layer is pinned.

21. The method according to claim 20, wherein said heating the magnetic tunnel junction includes passing a junction current pulse through the magnetic tunnel junction via the connecting current line when the select transistor is in an open mode.

22. The method according to claim 20, wherein said aligning the magnetization of the ferromagnetic storage layer is performed by a word magnetic field generated by passing a current through the word current line.

23. The method according to claim 20, wherein said aligning the magnetization of the ferromagnetic storage layer comprises one of aligning the magnetization of the ferromagnetic storage layer in a direction parallel with the fixed magnetization of the reference layer and aligning the magnetization of the ferromagnetic storage layer in a direction antiparallel with the fixed magnetization of the reference layer.

24. The method according to claim 20, wherein the magnetocrystalline anisotropy of the ferromagnetic storage layer and the long axis of the anisotropic shape of the magnetic tunnel junction form an angle within a range between eighty degrees and ninety degrees, inclusive.

* * * * *